(12) United States Patent
Cheng et al.

(10) Patent No.: US 9,911,739 B2
(45) Date of Patent: Mar. 6, 2018

(54) III-V FINFET CMOS WITH III-V AND GERMANIUM-CONTAINING CHANNEL CLOSELY SPACED

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/149,374

(22) Filed: May 9, 2016

(65) Prior Publication Data

US 2016/0254262 A1    Sep. 1, 2016

Related U.S. Application Data

(62) Division of application No. 14/500,304, filed on Sep. 29, 2014, now Pat. No. 9,337,196.

(51) Int. Cl.
*H01L 27/092* (2006.01)
*H01L 29/66* (2006.01)
(Continued)

(52) U.S. Cl.
CPC ...... *H01L 27/0924* (2013.01); *H01L 21/0262* (2013.01); *H01L 21/02532* (2013.01);
(Continued)

(58) Field of Classification Search
CPC ....... H01L 29/66795; H01L 21/823821; H01L 21/845; H01L 29/785; H01L 21/02532
See application file for complete search history.

(56) References Cited

U.S. PATENT DOCUMENTS 8,183,627 B2   5/2012   Currie
8,524,545 B2   9/2013   Anderson et al.
(Continued)

OTHER PUBLICATIONS

List of IBM Patents or Patent Applications Treated as Related dated May 9, 2016, 2 pages.

*Primary Examiner* — Tony Tran
(74) *Attorney, Agent, or Firm* — Scully, Scott, Murphy & Presser, P.C.; Daniel P. Morris, Esq.

(57) ABSTRACT

Closely spaced III-V compound semiconductor fins and germanium-containing semiconductor fins are provided by utilizing mandrel structures for III-V compound semiconductor material epitaxial growth and subsequent fin formation. Mandrel structures are formed on a semiconductor material stack that includes an uppermost layer of a relaxed germanium-containing material layer. A hard mask portion is formed on a pFET device region of the semiconductor material stack, and then recessed regions are provided in the relaxed germanium-containing material layer of the material stack semiconductor and in an nFET device region. An III-V compound semiconductor material plug is then formed in each recessed region. First sacrificial spacers are formed adjacent the sidewalls of each mandrel structures, and then each mandrel structure is removed. III-V compound semiconductor fins and germanium-containing semiconductor fins are then formed in the different device regions utilizing each first sacrificial spacer as an etch mask.

8 Claims, 11 Drawing Sheets

(51) Int. Cl.

| | |
|---|---|
| *H01L 21/02* | (2006.01) |
| *H01L 21/8258* | (2006.01) |
| *H01L 29/267* | (2006.01) |
| *H01L 29/06* | (2006.01) |
| *H01L 29/16* | (2006.01) |
| *H01L 29/161* | (2006.01) |
| *H01L 29/20* | (2006.01) |
| *H01L 29/78* | (2006.01) |
| *H01L 21/308* | (2006.01) |

(52) U.S. Cl.
CPC ...... *H01L 21/3086* (2013.01); *H01L 21/8258* (2013.01); *H01L 29/0649* (2013.01); *H01L 29/0657* (2013.01); *H01L 29/16* (2013.01); *H01L 29/161* (2013.01); *H01L 29/20* (2013.01); *H01L 29/267* (2013.01); *H01L 29/6653* (2013.01); *H01L 29/66795* (2013.01); *H01L 29/785* (2013.01); *H01L 29/66545* (2013.01)

(56) References Cited

U.S. PATENT DOCUMENTS

| | | | |
|---|---|---|---|
| 9,331,201 B2* | 5/2016 | Cheng | .................... H01L 29/785 |
| 2004/0227187 A1 | 11/2004 | Cheng et al. | |
| 2011/0049568 A1 | 3/2011 | Lochtefeld et al. | |
| 2012/0139007 A1 | 6/2012 | Tatsumura et al. | |
| 2012/0319211 A1* | 12/2012 | van Dal | ............ H01L 29/66795 257/401 |
| 2013/0119477 A1 | 5/2013 | Fumitake | |
| 2013/0134522 A1 | 5/2013 | Bhuwalka | |
| 2013/0309838 A1* | 11/2013 | Wei | .................... H01L 21/76229 438/424 |
| 2015/0214365 A1* | 7/2015 | Xie | ..................... H01L 29/7842 257/369 |

* cited by examiner

III-V FINFET CMOS WITH III-V AND GERMANIUM-CONTAINING CHANNEL CLOSELY SPACED

BACKGROUND

The present application relates to a semiconductor structure and a method of forming the same. More particularly, the present application relates to a method of forming a semiconductor structure including closely spaced III-V compound semiconductor fins and germanium-containing fins.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (finFETs) is the next step in the evolution of complementary metal oxide semiconductor (CMOS) devices. Semiconductor fin field effect transistors (FinFETs) can achieve higher drive currents with increasingly smaller dimensions as compared to conventional planar FETs.

Advanced hybrid channel finFETs containing both III-V compound semiconductor fins and germanium-containing semiconductor fins can be beneficial for 7 nm and beyond technology. A practical problem of forming III-V nFETs and germanium-containing pFETs is how to form the III-V compound semiconductor fins and germanium-containing semiconductor fins as close as possible to meet the ground rule requirement. In conventional processing, the III-V compound semiconductor fins and germanium-containing semiconductor fins are typically defined utilizing either lithographic patterning or a sidewall image transfer process. Both of these patterning methods cannot achieve the ground rule requirements for future technology nodes. As such, an alternative method is needed to provide III-V compound semiconductor fins and germanium-containing semiconductor fins that are closely spaced so as to meet the ground rule requirements of future technology nodes.

SUMMARY

Closely spaced III-V compound semiconductor fins and germanium-containing semiconductor fins are provided by utilizing mandrel structures for III-V compound semiconductor material epitaxial growth and subsequent fin formation. Mandrel structures are formed on a semiconductor material stack that includes an uppermost layer of a relaxed germanium-containing material layer. A hard mask portion is formed on a pFET device region of the semiconductor material stack, and then recessed regions are provided in the relaxed germanium-containing material layer of the material stack semiconductor and in an nFET device region. An III-V compound semiconductor material plug is then formed in each recessed region. First sacrificial spacers are formed adjacent the sidewalls of each mandrel structures, and then each mandrel structure is removed. III-V compound semiconductor fins and germanium-containing semiconductor fins are then formed in the different device regions utilizing each first sacrificial spacer as an etch mask.

In one aspect of the present application, a method of forming a semiconductor structure is provided. In one embodiment of the present application, the method includes providing a plurality of mandrel structures on a relaxed germanium-containing material layer of a semiconductor material stack containing a pFET device region and an nFET device region. Recessed openings are then formed into the relaxed germanium-containing material layer within the nFET device region of the semiconductor material stack, but not the pFET device region. An III-V compound semiconductor material plug is then formed in each recessed opening. Next, sacrificial spacers are formed on sidewall surfaces of each mandrel structures within the pFET device region and the nFET device region. Each mandrel structure is then removed from the pFET device region and the nFET device region. Next, a plurality of germanium-containing semiconductor fins is formed in exposed portions of the relaxed germanium-containing material layer in the pFET device region, and a plurality of III-V compound semiconductor fins is formed in exposed portions of the III-V compound semiconductor material plug in the nFET device region utilizing the sacrificial spacers as an etch mask. The order of forming the semiconductor fins may vary.

In another aspect of the present application, a semiconductor structure is provided. In one embodiment of the present application, the semiconductor structure includes a plurality of germanium-containing semiconductor fins located in a pFET device region and separated from each other by a pitch. A plurality of III-V compound semiconductor fins is located in an nFET device region and separated from each other by the pitch. In accordance with the present application, a neighboring pair of one germanium-containing fin of the plurality of germanium-containing semiconductor fins and one III-V compound semiconductor fins of the plurality of III-V compound semiconductor fins is also separated by the pitch.

DESCRIPTION

Figure 1:
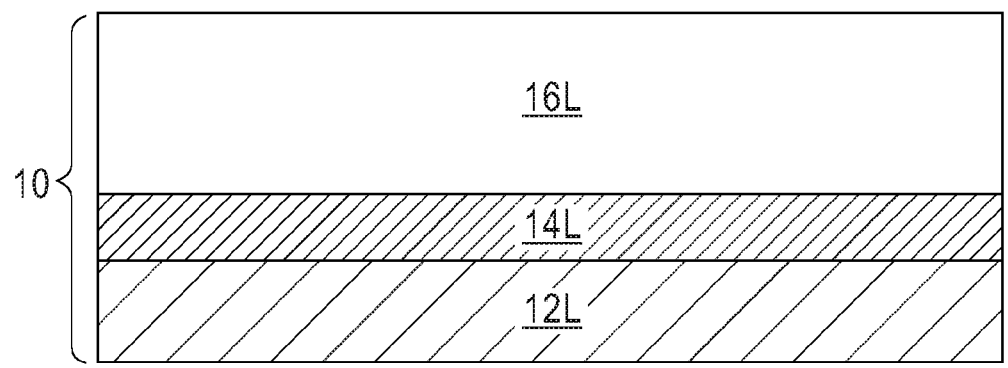
FIG. 1 is a cross sectional view illustrating an exemplary semiconductor structure including a semiconductor material stack of, from bottom to top, a silicon material layer, an intermediate layer of germanium, and a relaxed germanium-containing material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements in the various embodiments of the present application are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As mentioned above, prior art processes provide III-V compound semiconductor fins and germanium-containing semiconductor fins that are not closely spaced (typically the spacing is not at pitch, but multiple of a pitch or even larger) thus the prior art processes cannot meet the ground rule requirement of future technology nodes. The present application provides a method of forming III-V compound semiconductor fins (for nFET devices) and germanium-containing semiconductor fins (for pFET devices) that are closely spaced (i.e., at fin pitch, which is 20-100 nm from each other) and thus solves the problem mentioned above with prior art processes. Notably, closely spaced III-V compound semiconductor fins and germanium-containing semiconductor fins can be achieved in the present application by using sacrificial mandrel structures not only for fin formation, but also for III-V compound semiconductor material epitaxial growth. In addition to providing closely spaced III-V compound semiconductor fins (for nFET devices) and germanium-containing semiconductor fins (for pFET devices), the present application can also, in some embodiments, completely eliminate the formation of epitaxial defects at the trench edges.

Referring first to FIG. 1, there is illustrated an exemplary semiconductor structure including a semiconductor material stack 10 of, from bottom to top, a silicon material layer 12L, an intermediate layer of germanium 14L, and a relaxed germanium-containing material layer 16L that can be employed in an embodiment of the present application.

The term "silicon material layer" is used throughout the present application to denote a material layer that is comprised of unalloyed, i.e., pure, silicon. In one embodiment of the present application, the silicon material layer 12L may be comprised of single crystalline silicon. The silicon material layer 12L may be a relaxed silicon layer. The term "relaxed" is used throughout the present application to denote a material layer having no strain or a strain value that is less than 0.3%. In one embodiment of the present, the silicon material layer 12L of the material stack 10 may be a bulk silicon substrate. In another embodiment of the present application, the silicon material layer 12 may be a topmost surface of a silicon-on-insulator substrate which includes a buried insulator material and a handle substrate beneath the silicon material layer 12L.

The intermediate layer of germanium 14L, which has a bottommost surface in direct contact with a topmost surface of the silicon material layer 12L, is a contiguous layer that covers the entire topmost surface of the silicon material layer 12L. The intermediate layer of germanium 14L is comprised entirely of germanium. In one embodiment of the present application, the intermediate layer of germanium 14L can have a thickness from 100 nm to 10000 nm. In another embodiment of the present application, the intermediate layer of germanium 14L can have a thickness from 1000 nm to 5000 nm. Other thicknesses that are greater than or lesser than the aforementioned thickness ranges can also be employed for the intermediate layer of germanium 14L.

The relaxed germanium-containing material layer 16L, which has a bottommost surface in direct contact with a topmost surface of the intermediate layer of germanium 14L, is also a contiguous layer that covers the entire topmost surface of the intermediate layer of germanium 14L. The term "germanium-containing material" is used throughout the present application to denote unalloyed, i.e., pure, germanium, or a silicon germanium alloy having a germanium content of from 20 atomic % to 99 atomic %. The relaxed germanium-containing material layer 16L includes an upper portion that has fewer defects than a lower portion that is present at the interface with the underlying intermediate layer of germanium 14L. In one embodiment of the present application, the relaxed germanium-containing material layer 16L can have a thickness from 100 nm to 10000 nm. In another embodiment of the present application, the relaxed germanium-containing material layer 16L can have a thickness from 1000 nm to 5000 nm. Other thicknesses that are greater than or lesser than the aforementioned thickness ranges can also be employed for the relaxed germanium-containing material layer 16L so long as the germanium-containing material layer 16L remains relaxed.

The semiconductor material stack 10 shown in FIG. 1 can be formed by first providing the silicon material layer 12L. The silicon material layer 12L can be provided by techniques that are well known to those skilled in the art. After providing the silicon material layer 12L, the intermediate layer of germanium 14L and the relaxed germanium-containing material layer 16L can be formed by epitaxial deposition. In some embodiments of the present application, the intermediate layer of germanium 14L and the relaxed germanium-containing material layer 16L can be formed without breaking vacuum between the various epitaxial deposition steps. In yet other embodiments, the vacuum is broken between the epitaxial deposition of the intermediate layer of germanium 14L and epitaxial deposition of the relaxed germanium-containing material layer 16L.

The terms "epitaxial growth and/or deposition" and "epitaxially formed and/or grown" are used throughout the present application to denote the growth of a semiconductor material on a deposition surface of a semiconductor material, in which the semiconductor material being grown has the same crystalline characteristics as the semiconductor material of the deposition surface. Thus, in this instance, the intermediate layer of germanium 14L has an epitaxial relationship, i.e., same crystal orientation, with the underlying silicon material layer 12L, and the relaxed germanium-containing material layer 16L has an epitaxial relationship with the underlying intermediate layer of germanium 14L.

In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation.

Examples of various epitaxial growth process apparatuses that are suitable for use in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In some embodiments of the present application, and during the epitaxial growth of the relaxed germanium-containing material layer 16L, intermediate annealing steps may be performed to ensure that at least the uppermost portion of layer 16L is relaxed and to trap any defects in the lower portion of layer 16L. When employed, each intermediate anneal is performed in an inert ambient such a helium, argon, neon, or mixtures thereof. In some embodiments, the intermediate anneals can be performed in hydrogen. Also, each intermediate anneal is performed at a temperature from 600° C. to 950° C.

A number of different germanium source gases may be used for the deposition of the intermediate layer of germanium 14L. In some embodiments, the source gas for the deposition of the intermediate layer of germanium 14L may include germane, digermane, halogermane, dichlorogermane, trichlorogermane, tetrachlorogermane and combinations thereof. Carrier gases like hydrogen, nitrogen, helium and argon can be used.

A number of different source gases may be used in forming the relaxed germanium-containing material layer 16L. When the relaxed germanium-containing material layer 16L is comprised of unalloyed germanium, one of the germanium source gases mentioned above in providing the intermediate layer of germanium 14L can be employed. In some embodiments of the present application, a same germanium source gas is used in providing both the intermediate layer of germanium 14L and the relaxed germanium-containing material layer 16L. When the relaxed germanium-containing material layer 16L is comprised of a silicon germanium alloy, the relaxed germanium-containing material layer 16L can be formed utilizing a combination of a silicon source gas and a germanium source gas. Examples of a silicon source include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of a germanium source include germane, digermane, halogermane, dichlorogermane, trichlorogermane, tetrachlorogermane and combinations thereof. In some embodiments, a source gas including a combination of a silicon source material and a germanium source material may be used in providing a relaxed germanium-containing material layer 16L comprised of a silicon germanium alloy material. Carrier gases like hydrogen, nitrogen, helium and argon can also be used to form the relaxed germanium-containing material layer 16L.

Figure 2:
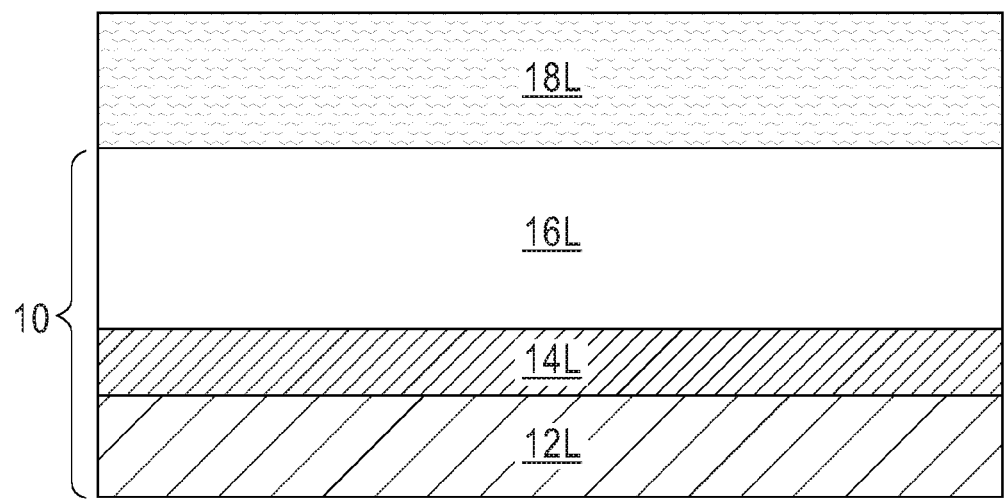
FIG. 2 is a cross sectional view of the exemplary semiconductor structure of FIG. 1 after forming a mandrel material layer on the topmost surface of the semiconductor material stack.

Referring now to FIG. 2, there is illustrated the exemplary semiconductor structure of FIG. 1 after forming a mandrel material layer 18L on the topmost surface of the semiconductor material stack 10L. In the present application, the mandrel material layer 18L is formed directly on a topmost surface of the relaxed germanium-containing material layer 16L. As is shown, the mandrel material layer 18L is a contiguous layer that covers the entire topmost surface of the relaxed germanium-containing material layer 16L.

The mandrel material layer 18L can include any material (semiconductor, dielectric or conductive) that can be selectively removed from the structure during a subsequently performed etching process. A single material can be used in providing the mandrel material layer 18L, or a multilayered stack of materials can be used in providing the mandrel material layer 18L. In one embodiment, the mandrel material layer 18L may be composed of polysilicon. In another embodiment, the mandrel material layer 18L may be composed of amorphous carbon. In yet a further embodiment, the mandrel material layer 18L may be composed of a metal such as, for example, Al, W, or Cu. The mandrel material layer 18L can be formed by a deposition process such as, for example, by chemical vapor deposition or plasma enhanced chemical vapor deposition. The thickness of mandrel material layer 18L can be from 50 nm to 300 nm, although lesser and greater thicknesses can also be employed.

Figure 3:
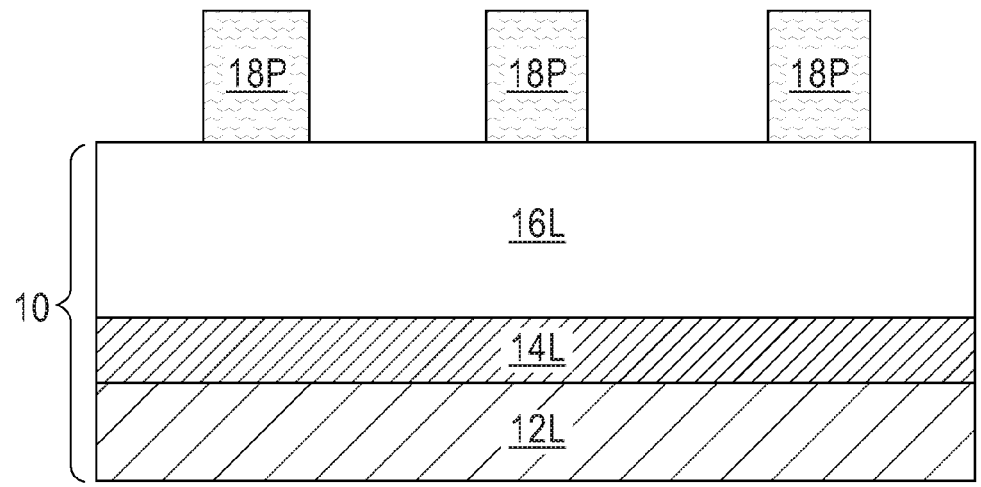
FIG. 3 is a cross sectional view of the exemplary semiconductor structure of FIG. 2 after patterning the mandrel material layer to provide a plurality of mandrel structures on the topmost surface of the semiconductor material stack.

Referring now to FIG. 3, there is illustrated the exemplary semiconductor structure of FIG. 2 after patterning the mandrel material layer 18L to provide a plurality of mandrel structures 18P on the topmost surface, i.e., the germanium-containing material layer 16L, of the semiconductor material stack 10. The patterning of the mandrel material layer 18L can be performed by lithography and etching. Lithography can include forming a photoresist material above the mandrel material layer 18L, exposing the photoresist material to a desired pattern of radiation and developing the photoresist utilizing a conventional photoresist developer. After the photoresist material has been patterned, the pattern provided to the photoresist material can be transferred to the underlying mandrel material layer 18L by etching. In one embodiment, the etch used for pattern transfer may be a dry etching process such as, for example, reactive ion etching, plasma etching, ion beam etching or laser ablation. In another embodiment, the etch used for the pattern transfer may include a chemical wet etchant that is selective in removing the exposed portions of the mandrel material layer 18L.

In the embodiment that is illustrated in FIG. 3, each mandrel structure 18P that is formed has a constant width and is spaced apart from a neighboring mandrel structure by a constant pitch. In one embodiment, the width of each mandrel structure 18P, as measured from one sidewall surface to an opposing sidewall surface, is from 30 nm to 60 nm, although lesser and greater widths can also be employed.

Figure 4:
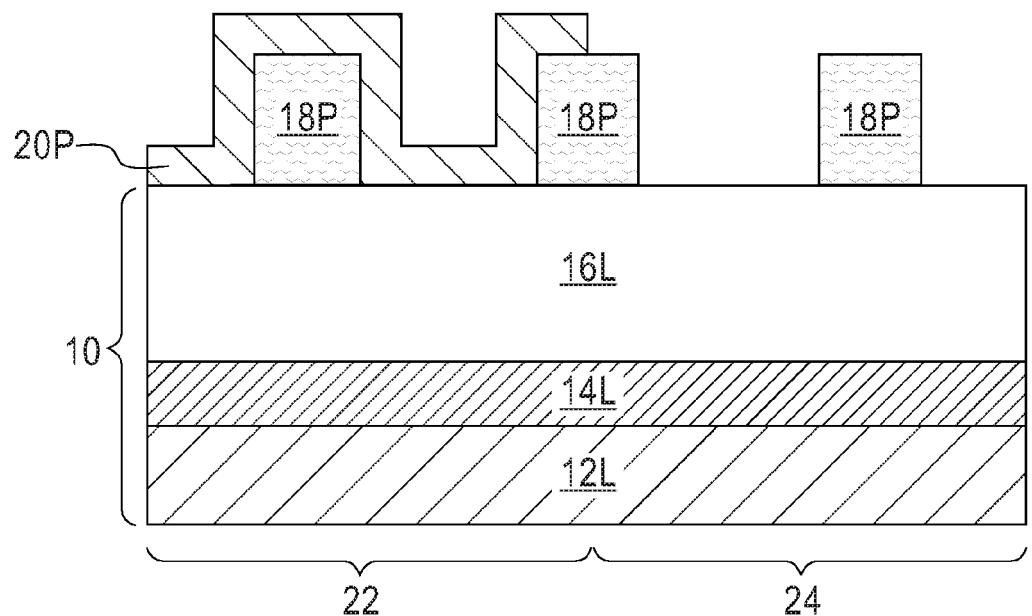
FIG. 4 is a cross sectional view of the exemplary semiconductor structure of FIG. 3 after providing a hard mask material portion covering a pFET device region of the semiconductor material stack, while leaving an nFET device region of the semiconductor material stack exposed.

Referring now to FIG. 4, there is illustrated the exemplary semiconductor structure of FIG. 3 after providing a hard mask material portion 20P covering a pFET device region 22 of the semiconductor material stack 10, while leaving an nFET device region 24 of the semiconductor material stack 10 exposed. As is shown, the hard mask portion 20P covers the mandrel structures 18P that are positioned in the pFET device region 22. When a mandrel structure is present at the boundary between the pFET device region 22 and the nFET device region 24, as is the case with the middle mandrel structure shown in FIG. 4, the hard mask material portion 20P is present only on portions of the mandrel structure that are present in the pFET device region 22.

The hard mask material portion 20P comprises a hard mask material. When the mandrel material layer 18L is comprised of a dielectric material, then the hard mask material that provides the hard mask material portion 20P comprises a different dielectric material than the dielectric material used to provide the mandrel material layer 18L. The hard mask material that can be used in providing the hard mask material portion 20P may include a semiconductor oxide, a semiconductor nitride and/or a semiconductor oxynitride. In one embodiment, the hard mask material that can be used in providing the hard mask material portion 20P can be comprised of silicon dioxide. In another embodiment, the hard mask material that can be used in providing the hard mask material portion 20P can be comprised of silicon nitride. In yet another embodiment, the hard mask material that can be used in providing the hard mask material portion 20P can be a stack comprised of, in any order, silicon dioxide and silicon nitride. The thickness of the hard mask material that can be used in providing the hard mask material portion 20P can range from 2 nm to 10 nm, with a thickness from 3 nm to 6 nm being more typical.

In one embodiment of the present application, the hard mask material portion 20P can be formed by providing a hard mask material on the exposed topmost surface of the exemplary semiconductor structure shown in FIG. 3, and then patterning the hard mask material by lithography and etching. In another embodiment, the hard mask portion 20P can be formed by first providing a block mask protecting the nFET device region 24, the hard mask material is then provided to the pFET device region 22, and thereafter the block mask is removed from the nFET device region 24.

Notwithstanding which technique is employed in forming the hard mask material portion 20P, the hard mask material that can be used in providing the hard mask material portion 20P can be formed by a deposition process such as, for example, chemical vapor deposition (CVD) or plasma enhanced chemical vapor deposition (PECVD).

Figure 5:
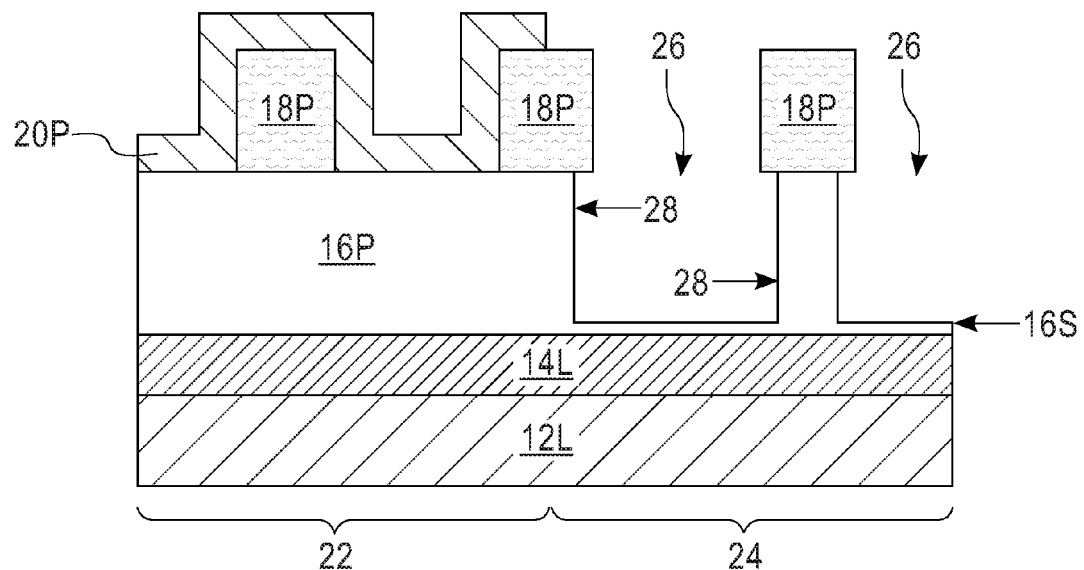
FIG. 5 is a cross sectional view of the exemplary semiconductor structure of FIG. 4 after providing recessed openings extending partially through the germanium-containing material layer in the nFET device region utilizing each mandrel structure in the nFET device region as an etch mask.

Referring now to FIG. 5, there is illustrated the exemplary semiconductor structure of FIG. 4 after providing recessed openings, i.e., trenches, 26 extending partially through the relaxed germanium-containing material layer 16L in the nFET device region 24 utilizing each mandrel structure 18P in the nFET device region 24 as an etch mask. Since the hard mask material portion 20P covers the pFET device region 22, no material removal occurs in the pFET device region 22. The remaining portion of the relaxed germanium-containing material layer 16L can now be referred to as a "germanium-containing material portion 16P.

The recessed openings, i.e., trenches, 26 which extend partially through the germanium-containing material layer 16L in the nFET device region 24 expose a sub-surface 16S of the relaxed germanium-containing material layer 16L in the nFET device region 24. The term "sub-surface" is used throughout the present application to denote a surface of a material layer that is below the original topmost surface of the material layer. In one embodiment of the present application, each recessed opening 26 that is formed has a depth, as measured from the original topmost surface of the relaxed germanium-containing material layer 16L to the exposed sub-surface 16S, of from 100 nm to 2000 nm. Other depths are possible as long as the bottommost surface of each recessed opening does not directly contact the underlying intermediate layer of germanium 14L.

The recessed openings 26 which extend partially through the relaxed germanium-containing material layer 16L in the nFET device region 24 can be formed utilizing an etching process that is selective in removing the relaxed germanium-containing material layer 16L relative to the materials that provide the hard mask material portions 20P and the mandrel structure 18P. In one embodiment of the present application, the etching used to provide the recessed openings 26 within the nFET device region 24 comprises an anisotropic etch such as, for example, reactive ion etching. When an anisotropic etch is employed in providing the recessed openings 26, the sidewall surfaces of the recessed openings 26 would be vertical coincident to the sidewall surfaces of the overlying mandrel structures 18P.

In some embodiments (and as shown in the drawing), a portion of the relaxed germanium-containing material layer 16P that is present beneath the overlying mandrel structures 18P in the nFET device region 24 can be laterally etched to provide recessed openings 26 whose sidewall surfaces 28 undercut the overlying mandrel structures 18P. In one embodiment of the present application, such recessed openings 26 can be formed by performing a lateral pull back etch during the etch that provides the recessed openings 26. In another embodiment of the present application, the lateral pull back etch can be performed after an initial etch that provides recessed openings 26 having sidewall surfaces that are vertically coincident to the sidewall surfaces of the overlying mandrel structures 18P. For example, an isotropic etch can be used to provide the recessed openings 26 having sidewall surfaces 28 as shown in FIG. 5.

Figure 6:
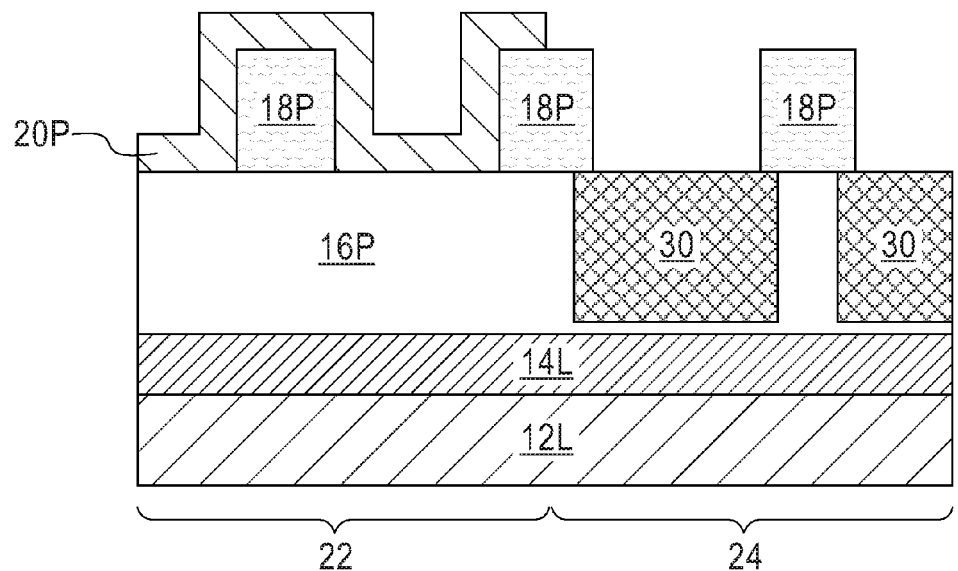
FIG. 6 is a cross sectional view of the exemplary semiconductor structure of FIG. 5 after filling the openings within the nFET device region with an III-V compound semiconductor material plug.

Referring to FIG. 6, there is illustrated the exemplary semiconductor structure of FIG. 5 after filling the recessed openings 26 within the nFET device region 24 with an III-V compound semiconductor material plug 30. The III-V compound semiconductor material plug 30 completely fills each recessed opening 26. The III-V compound semiconductor material plug 30 has a bottommost surface that directly contacts the exposed sub-surface 16S of the relaxed germanium-containing material portion 16P. The III-V compound semiconductor material plug 30 has a topmost surface that is typically coplanar with a topmost surface of the relaxed germanium-containing material portion 16P. In some embodiments (not shown), the topmost surface of the III-V compound semiconductor material plug 30 extends above the topmost surface of the relaxed germanium-containing material portion 16P. In other embodiments, and as shown, a portion of the topmost surface of the III-V compound semiconductor material plug 30 directly contacts a bottommost surface of the mandrel structures 18P in the nFET device region 24.

The III-V compound semiconductor material plug 30 includes at least one III-V compound semiconductor material that contains at least one element from Group IIIA of the Periodic Table of Elements and at least one element from Group VA of the Periodic Table of Elements. For example, the III-V compound semiconductor material plug 30 can comprise GaAs, InP, InAs, and GaInP. In some embodiments of the present application (and as shown in FIG. 6), the III-V compound semiconductor material plug 30 may include a single III-V compound semiconductor material. In other embodiments of the present application (not shown), the III-V compound semiconductor material plug 30 may include two or more III-V compound semiconductor materials stacked one atop the other.

The III-V compound semiconductor material that provides the III-V compound semiconductor material plug 30 can be formed utilizing an epitaxial deposition process as described above in forming the intermediate layer of germanium 14L and the relaxed germanium-containing material layer 16L. Since an epitaxial deposition process is used in forming the III-V compound semiconductor material that provides the III-V compound semiconductor material plug 30, the III-V compound semiconductor material plug 30 has an epitaxial relationship with the exposed sub-surface 16S of the relaxed germanium-containing material portion 16P.

In some embodiments, the epitaxial deposition of the III-V compound semiconductor material that provides the III-V compound semiconductor material plug 30 can be performed utilizing one of the epitaxial deposition apparatuses mentioned and the conditions for epitaxial growing the III-V compound semiconductor material that provides the III-V compound semiconductor material plug 30 can be the same as those mentioned above in forming the intermediate layer of germanium 14L and the relaxed germanium-containing material layer 16L. The III-V compound semiconductor material that provides the III-V compound semiconductor material plug 30 can be formed utilizing any well known source gas(es) that is(are) typically used in epitaxially growing a III-V compound semiconductor material.

In other embodiments, the epitaxial deposition of the III-V compound semiconductor material that provides the III-V compound semiconductor material plug 30 can include an epitaxial semiconductor regrowth process such as is described, for example, in U.S. Patent Application Publication No. 2011/0049568 to Lochtefeld et al., the entire content and disclosure of which is incorporated herein by reference. This epitaxial semiconductor regrowth may be referred to herein as an aspect ratio trapping process. In the present application, the aspect ratio trapping process typically works better when the aspect ratio (trench depth to trench width) of the trench is at least 1:2. When an aspect ratio trapping process is employed, the III-V compound semiconductor material plug 30 may include a lower portion having a first defect density and an upper portion having a second defect density that is less than the first defect density.

In some embodiments of the present application and when aspect ratio trapping is employed, the selected crystallographic direction of the III-V compound semiconductor material that provides the III-V compound semiconductor material plug 30 is aligned with at least one propagation direction of threading dislocations in the recessed opening 26 in which each III-V compound semiconductor material plug 30 is formed. Threading dislocations in this region may substantially terminate at the sidewall of the neighboring relaxed germanium-containing material 16P. In one embodiment of the present application, the selected crystallographic direction of the sub-surface 16S of the relaxed germanium-containing material portion 16P is aligned with direction of propagation of threading dislocations in the III-V compound semiconductor material that provides the III-V compound semiconductor material plug 30. In certain embodiments, the orientation angle ranges from about 30 to about 60 degrees, for example, is about 45 degrees to such crystallographic direction. The surface of the sub-surface 16S of the relaxed germanium-containing material portion 16P may have a (100), (110), or (111) crystallographic orientation. In some embodiments, the selected crystallographic direction is substantially aligned with a <110> crystallographic direction of the sub-surface 16S of the relaxed germanium-containing material portion 16P.

In some embodiments of the present application, a planarization process such as, for example, an etch back process, follows the epitaxial deposition of the III-V compound semiconductor material that provides the III-V compound semiconductor material plug 30.

Figure 7:
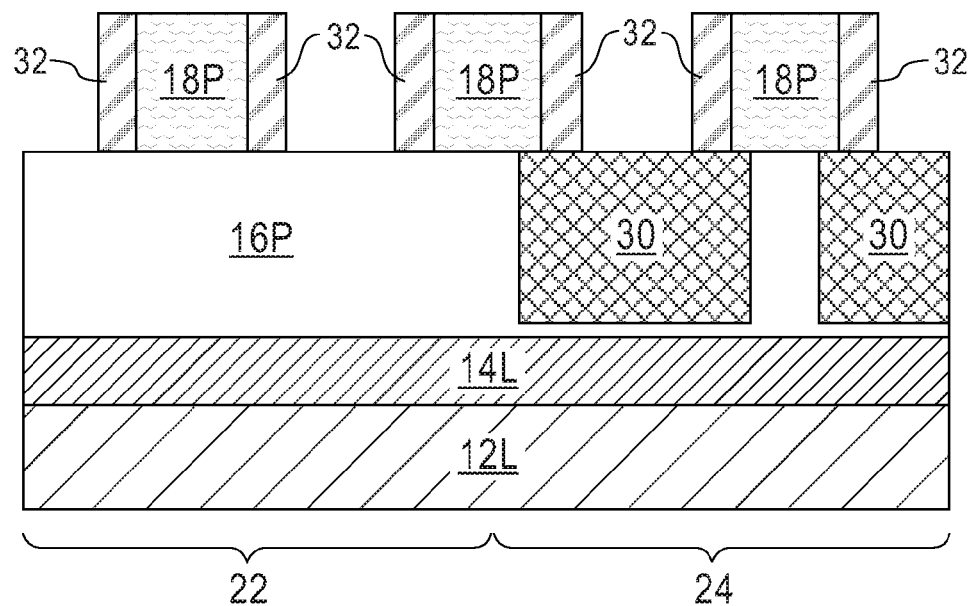
FIG. 7 is a cross sectional view of the exemplary semiconductor structure of FIG. 6 after removing the hard mask material portion from the pFET device region, and forming a first sacrificial spacer on sidewall surfaces of each mandrel structure in the pFET device region and the nFET device region.

Referring now to FIG. 7, there is illustrated the exemplary semiconductor structure of FIG. 6 after removing the hard mask material portion 20P from the pFET device region 22, and forming a first sacrificial spacer 32 on sidewall surfaces of each mandrel structure 18P in the pFET device region 22 and the nFET device region 24.

The hard mask material portion 20P can be removed from the structure utilizing an etching process that selectively removes the hard mask material that provides the hard mask material portion 20P as compared to the material of the mandrel structure, the relaxed germanium-containing material portion 16P, and the III-V compound semiconductor material plug 30. The removal of the hard mask material portion 20P exposes the pFET device region 22 for further processing.

After removing the hard mask material portion 20P from the pFET device region 22, first sacrificial spacers 32 are formed on the exposed sidewall surfaces of each mandrel structure 18P. As is shown, each first sacrificial spacer 32 has a topmost surface that is coplanar with a topmost surface of each mandrel structure 18P. As is also shown, some of the first sacrificial spacers 32 have a bottommost surface located directly on a topmost surface of the relaxed germanium-containing material portion 16P, while other first sacrificial spacers 32 have a bottommost surface located directly on a topmost surface of one of the III-V compound semiconductor material plugs 30. Each first sacrificial spacer 32 has a width that is less than a width of each mandrel structure 18P. Typically, each first sacrificial spacer 32 has a width, as measured from one sidewall surface to an opposing, sidewall surface, of from 4 nm to 20 nm. It is noted that the width of the first sacrificial spacer 32 defines the width of each semiconductor fin to be subsequently formed.

Each first sacrificial spacer 32 may comprise a first dielectric spacer material that has a different etching characteristics compared to the material of the mandrel structures 18P. In one embodiment of the present application, each first sacrificial spacer 32 may include a nitride such as silicon nitride, an oxide such as silicon dioxide, or an oxynitride such as silicon oxynitride. In another embodiment of the present application, the dielectric material that is used in providing each first sacrificial spacer 32 may be a dielectric material having a dielectric constant of less than silicon dioxide (such dielectric materials may be referred to herein as low k). Examples of dielectric materials having a low dielectric constant include, but are not limited to, silsesquioxanes, C-doped oxides (i.e., organic silicates) that include atoms of Si, C, O and H, and thermosetting polyarylene ethers. The term "polyarylene" is used throughout the present application to denote aryl moieties or inertly substituted aryl moieties which are linked together by bonds, fused rings, or inert linking groups such as, for example, oxygen, sulfur, sulfone, sulfoxide, carbonyl and the like. In yet another embodiment of the present application, the dielectric material that is used in providing each first sacrificial spacer 32 may be a dielectric material having a dielectric constant that is equal to or even greater than that of silicon dioxide (such dielectric materials may be referred to herein as high k). Examples of high k dielectric materials include, for example, a dielectric metal oxide such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2.

Each first sacrificial spacer 32 may be formed by first conformally depositing a dielectric spacer material layer over each mandrel structure 18P, over exposed topmost surfaces of the relaxed germanium-containing material portion 16P and over exposed topmost surfaces of each III-V compound semiconductor material plug 30. After depositing the dielectric spacer material layer, the dielectric spacer material layer can be anisotropically etched to remove horizontal portions of the dielectric spacer material layer forming the first sacrificial spacers 32 shown in FIG. 7.

Figure 8:
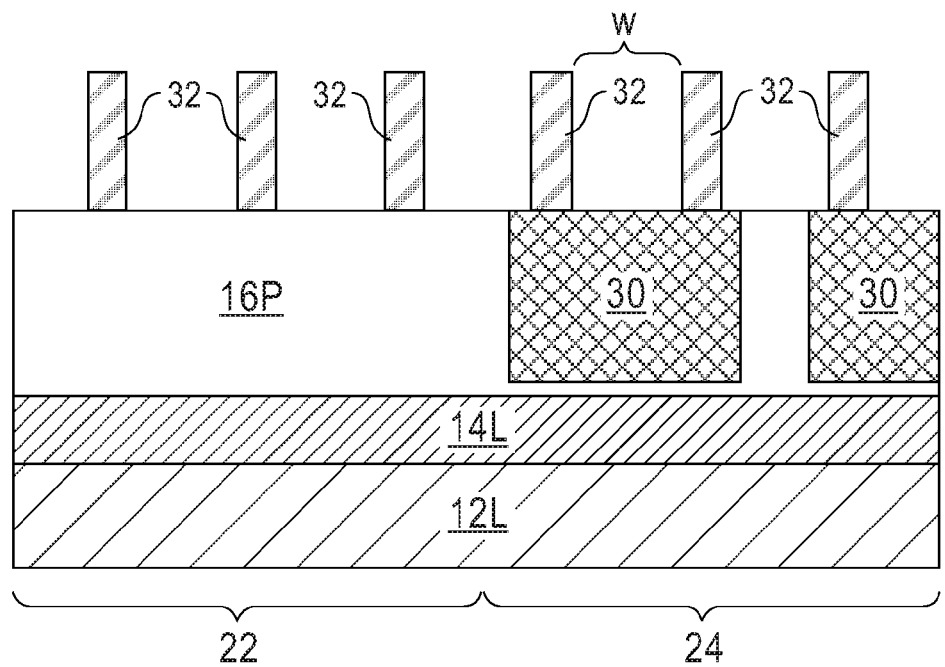
FIG. 8 is a cross sectional view of the exemplary semiconductor structure of FIG. 7 after removing each mandrel structure from the pFET device region and the nFET device region.

Referring now to FIG. 8, there is illustrated the exemplary semiconductor structure of FIG. 7 after removing each mandrel structure 18P from the pFET device region 22 and the nFET device region 24, while maintaining the first sacrificial spacers 32 on the exposed topmost surfaces of the relaxed germanium-containing material portion 16P and the exposed topmost surfaces of each III-V compound semiconductor material plug 30. Each mandrel structure 18P can be removed utilizing an etching process that is selective in removing the material that provides each mandrel structure 18P as compared to the dielectric spacer material that provides each first sacrificial spacer 32. The etch process that can be used to remove each mandrel structure 18P can be an anisotropic or an isotropic etch. As is shown in FIG. 8, each first sacrificial spacer 32 is uniformly spaced apart by a width, w, which is equal to the width of the mandrel structure 18P.

Figure 9:
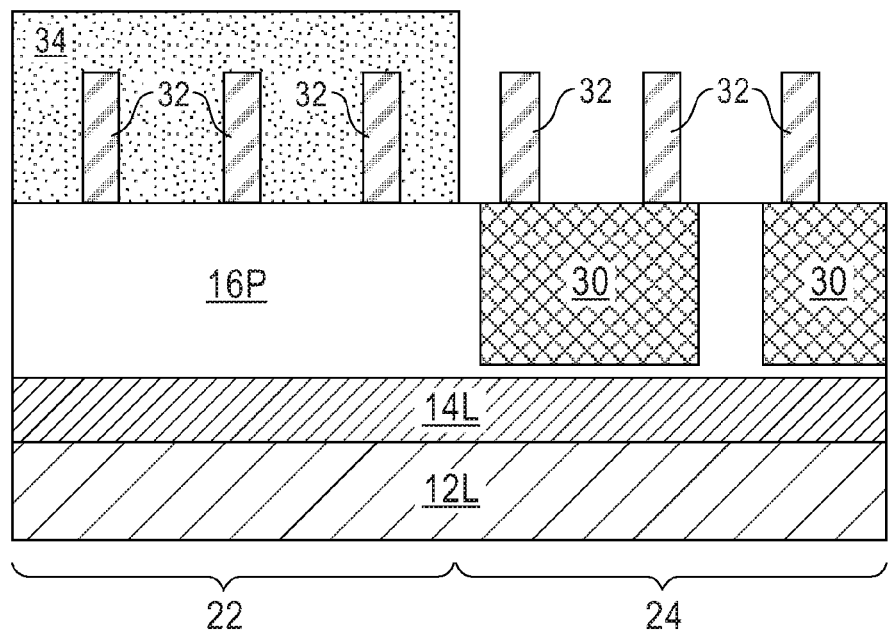
FIG. 9 is a cross sectional view of the exemplary semiconductor structure of FIG. 8 after forming a first block mask covering the pFET device region.

Referring now to FIG. 9, there is illustrated the exemplary semiconductor structure of FIG. 8 after forming a first block mask 34 covering the pFET device region 22, while leaving the nFET device region 24 exposed for further processing. The first block mask 34 may be a photoresist material, a hard mask material (having a composition different from the first sacrificial spacer 32), or a multilayered combination thereof. The first block mask can be formed by deposition of a block mask material, followed by lithography and optionally etching.

Figure 10:
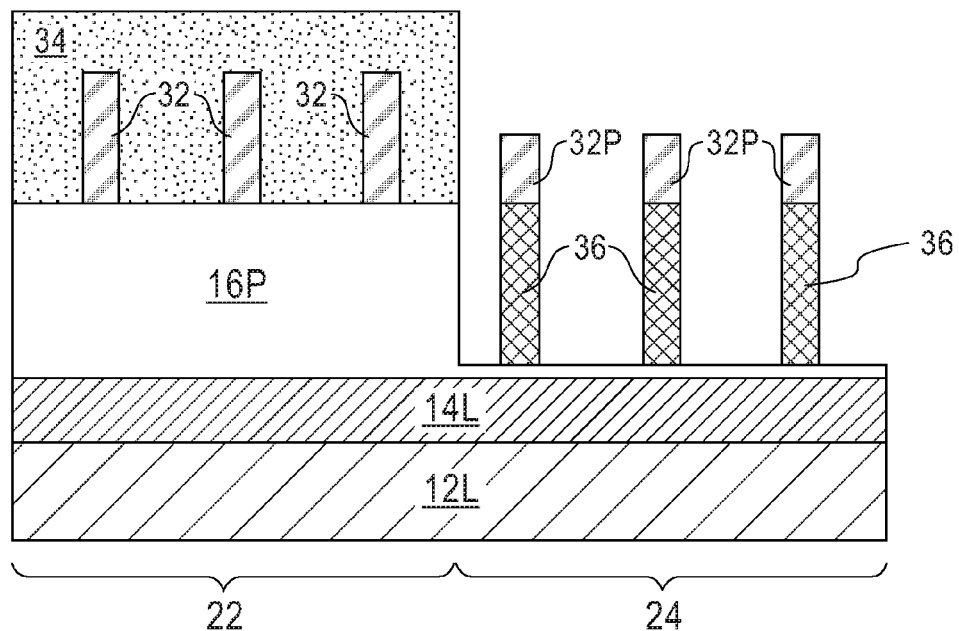
FIG. 10 is a cross sectional view of the exemplary semiconductor structure of FIG. 9 after forming a plurality of III-V compound semiconductor fins within the nFET device region.

Referring now to FIG. 10, there is illustrated the exemplary semiconductor structure of FIG. 9 after forming a plurality of III-V compound semiconductor fins 36 within the nFET device region 24. The plurality of III-V compound semiconductor fins 36 is formed by removing exposed portions of each the III-V compound semiconductor material plug 30 not protected by the first sacrificial spacers 32. The removal of the exposed portions of each the III-V compound semiconductor material plug 30 not protected by the first sacrificial spacers 32 can be performed utilizing an anisotropic etching process such as, for example, reactive ion etching. In some embodiments (and as shown), the etch stops on sub-surface 16S of the relaxed germanium-containing material portion 16P. In other embodiment this etch may stop at the bottommost surface of the III-V compound semiconductor material plug 30 or even somewhere in the III-V compound semiconductor material plug 30. During this etch, an upper portion of the first sacrificial spacers 32 within the nFET device region 24 can be removed.

Each III-V compound semiconductor fin 36 comprises a remaining portion of the III-V compound semiconductor material plug 30. Each III-V compound semiconductor fin 36 can be capped with a remaining portion of the first sacrificial spacer 32. The remaining portion of first sacrificial spacer 32 can be referred to herein as a first sacrificial cap portion 32P. As used herein, a "fin" refers to a contiguous structure including a semiconductor material and including a pair of vertical sidewalls that are parallel to each other. As used herein, a surface is "vertical" if there exists a vertical plane from which the surface does not deviate by more than three times the root mean square roughness of the surface.

Figure 11:
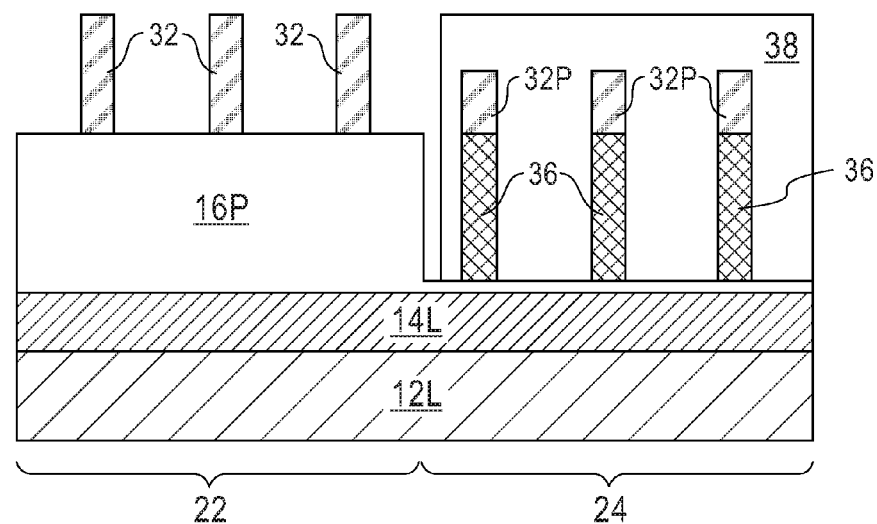
FIG. 11 is a cross sectional view of the exemplary semiconductor structure of FIG. 10 after removing the first block mask from the pFET device region, and providing a second block mask covering the nFET device region.

Referring now to FIG. 11, there is illustrated the exemplary semiconductor structure of FIG. 10 after removing the first block mask 34 from the pFET device region 22, and providing a second block mask 38 covering each III-V compound semiconductor fin 36 in the nFET device region 24. The removal of the first block mask 34 can be performed by either a conventional resist stripping process and/or by utilizing an etch that is selective in removing the material of the first block mask 34. The second block mask 38 can include one of the block mask materials mentioned above for the first block mask 34. The second block mask 38 can be formed utilizing the technique mentioned above in forming the first block mask 34. The second block mask 38 covers the entirely of the III-V semiconductor fins 36 within the nFET device region 24.

Figure 12:
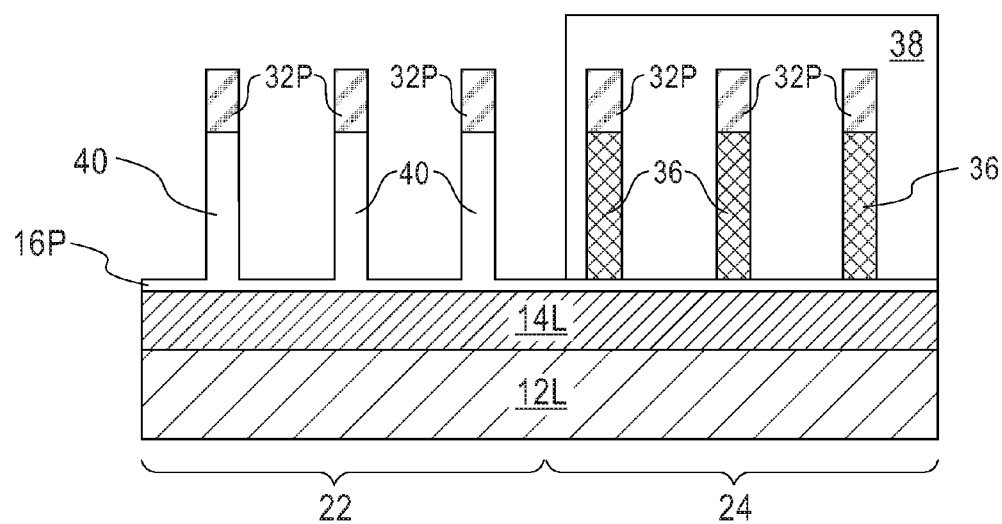
FIG. 12 is a cross sectional view of the exemplary semiconductor structure of FIG. 11 after forming a plurality of germanium-containing fins within the pFET device region.

Referring now to FIG. 12, there is illustrated the exemplary semiconductor structure of FIG. 11 after forming a plurality of germanium-containing semiconductor fins 40 within the pFET device region 22. The plurality germanium-containing semiconductor fins 40 is formed by removing exposed portions of each the relaxed germanium-containing material portion 16P not protected by the first sacrificial spacers 32. The removal of the exposed portions of each the relaxed germanium-containing material portion 16P not protected by the first sacrificial spacers 32 can be performed utilizing an anisotropic etching process such as, for example, reactive ion etching. The etch stop on another sub-surface of the relaxed germanium-containing material portion 16P. In some embodiments (and as shown), the another sub-surface is coplanar with sub-surface 16S. In other embodiments (not shown), the another sub-surface exposed in the pFET device region 22 can located above or located beneath the sub-surface 16S exposed in the nFET device region 24. During this etch, an upper portion of the first sacrificial spacers 32 within the pFET device region 22 can be removed.

Each germanium-containing semiconductor fin 40 comprises a remaining portion of the relaxed germanium-containing material portion 16P. Each germanium-containing semiconductor fin 40 can be capped with a remaining portion of the first sacrificial spacer 32. The remaining portion of first sacrificial spacer 32 can be referred to herein as a first sacrificial cap portion 32P.

Figure 13:
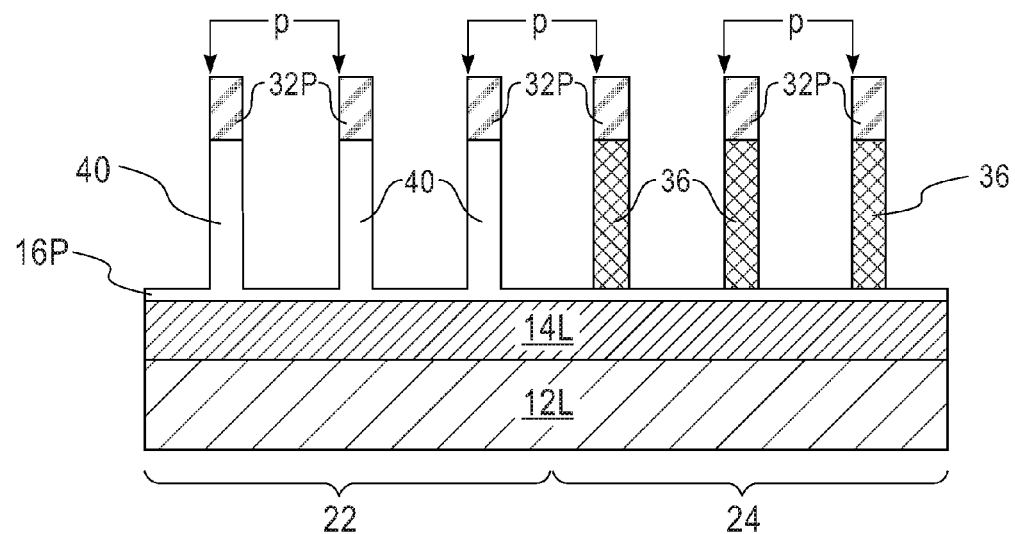
FIG. 13 is a cross sectional view of the exemplary semiconductor structure of FIG. 12 after removing the second block mask from the nFET device region.

Referring now to FIG. 13, there is illustrated the exemplary semiconductor structure of FIG. 12 after removing the second block mask 38 from the nFET device region 24. The removal of the second block mask 38 can be performed by either a conventional resist stripping process and/or by utilizing an etch that is selective in removing the material of the second block mask 38.

In some embodiments and as shown, each of the germanium-containing semiconductor fins 40 has a topmost surface that is co-planar with a topmost surface of each of the III-V compound semiconductor fins 36. In other embodiments (not shown), each of the germanium-containing semiconductor fins 40 has a topmost surface that is located above or beneath a topmost surface of each of the III-V compound semiconductor fins 36.

As is shown in FIG. 13, each of the germanium-containing semiconductor fins 40 and each of the III-V compound semiconductor fins 36 are spaced at a first pitch, p. Also, and as shown in FIG. 13, the nearest neighboring pair of germanium-containing semiconductor fin 40 and III-V compound semiconductor fin 36 is spaced at the same pitch (i.e., the first pitch) as the pitch between individual same semiconductor material fins. The pitch can be between 20 nm and 100 nm. In the present application, the pitch (i.e. first pitch) is defined as the space between fin plus fin width.

It is noted that although the present application describes and illustrates the formation of the III-V compound semiconductor fins 36 in the nFET device region 24 prior to forming the germanium-containing semiconductor fin 40 in the pFET device region 22, the present application also works when the germanium-containing semiconductor fins 40 are formed prior to forming the III-V compound semiconductor fins 36. In such an embodiment, the order of block mask formation and fin etching described above would be reversed.

Figure 14:
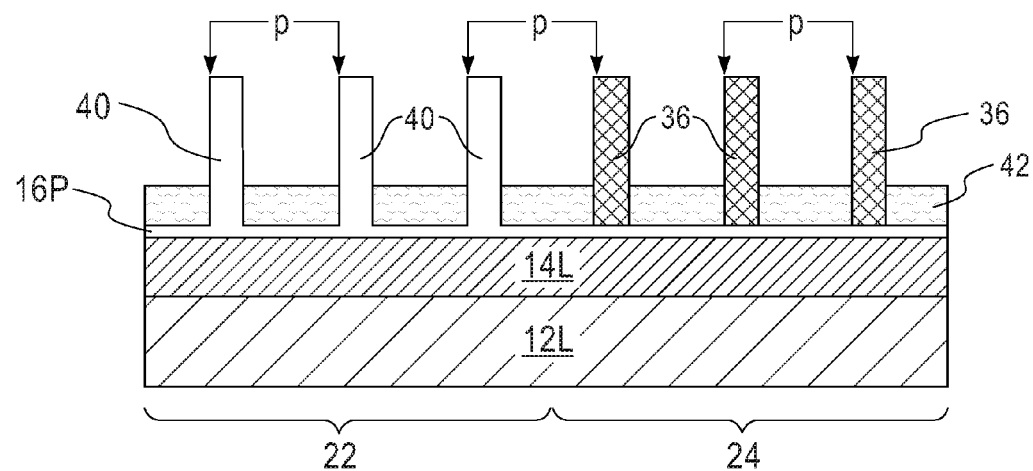
FIG. 14 is a cross sectional view of the exemplary semiconductor structure of FIG. 13 after forming local fin isolation structures between each germanium-containing semiconductor fin within the pFET device region and between each III-V compound semiconductor fin within the nFET device region.

Referring now to FIG. 14, there is illustrated the exemplary semiconductor structure of FIG. 13 after forming local fin isolation structures 42 between each germanium-containing semiconductor fin 40 within the pFET device region 22 and between each III-V compound semiconductor fin 36 within the nFET device region 24. In some embodiments, and during the formation of the local fin isolation structures 42, the remaining portion of the first sacrificial spacer 32P can be removed from atop each germanium-containing semiconductor fin 40 within the pFET device region 22 and atop each III-V compound semiconductor fin 36 within the nFET device region 24. In another embodiment of the present application, the remaining portion of the first sacrificial spacer 32P is not removed from atop each germanium-containing semiconductor fin 40 within the pFET device region 22 and atop each III-V compound semiconductor fin 36 within the nFET device region 24. In such an embodiment, the remaining portion of the first sacrificial spacer 32P serves as fin cap.

The local fin isolation structure 42 can be formed by first filling the spaces between each semiconductor fin with a dielectric oxide material such as, for example, silicon dioxide. In some embodiments, a planarization process such as, for example, chemical mechanical planarization follows the deposition of the dielectric oxide material. When employed, the planarization process removes any dielectric oxide material that is present above the semiconductor fins 36, 40. The planarization process can also remove the remaining portion of the first sacrificial spacer 32P from each semiconductor fin 36, 40. An etch back process can then be employed to recess the dielectric oxide material below the topmost surface of each semiconductor fin 36, 40 forming each local isolation structure 42 shown in FIG. 14.

Each local fin isolation structure 42 that is formed has a topmost surface that is vertically offset and located beneath the topmost surface of each semiconductor fin 36, 40. Each local fin isolation structure 42 is present at the footprint of a semiconductor fin 36, 40 and has a thickness from 20 nm to 200 nm. A bottommost surface of each local fin isolation structure 42 is present on a surface of the remaining germanium-containing semiconductor portion 16P.

Figure 15:
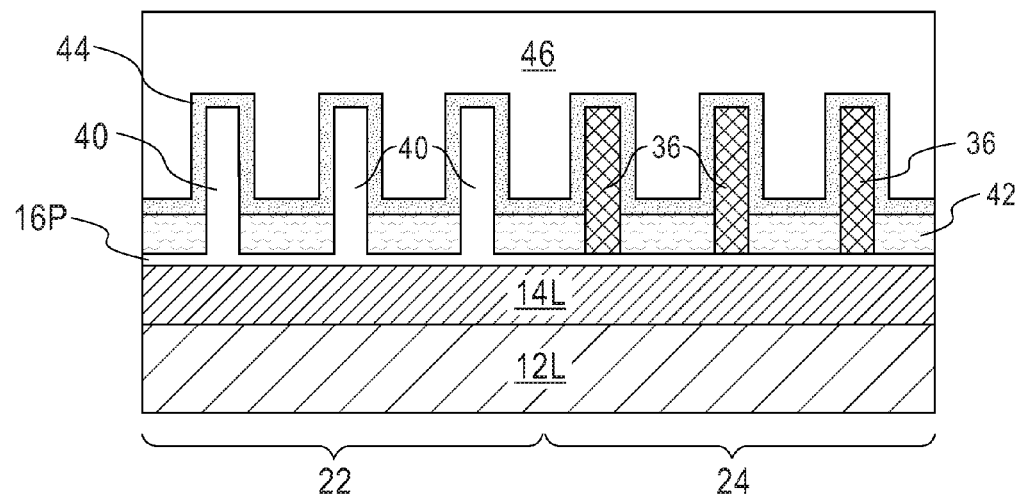
FIG. 15 is a cross sectional view of the exemplary semiconductor structure of FIG. 14 after forming a functional gate structure straddling each germanium-containing semiconductor fin within the pFET device region and each III-V compound semiconductor fin within the nFET device region.

Referring now to FIG. 15, there is illustrated the exemplary semiconductor structure of FIG. 14 after forming a functional gate structure (44, 46) straddling each germanium-containing semiconductor fin 40 within the pFET device region 22 and each III-V compound semiconductor fin 36 within the nFET device region 24. Although a single functional gate structure (44, 46) is described and illustrated in the drawing, a plurality of functional gate structures can be formed. By "straddling" it is meant that the functional gate structure is located directly above a topmost surface of the semiconductor fin as well as adjacent two vertical sidewalls of the semiconductor fin. The term "functional gate structure" is used throughout the present application as a permanent gate structure used to control output current (i.e., flow of carriers in the channel) of a semiconducting device through electrical or magnetic fields. The functional gate structure (44, 46) can be formed utilizing a gate first process or a gate last process.

In a gate first process, at least one functional gate structure is formed prior to forming the source and drain regions. The at least one functional gate structure can be formed by deposition of a gate material stack and then patterning the gate material stack by lithography and etching.

The at least one functional gate structure includes a gate dielectric material portion 44 and a gate conductor portion 46. While the embodiment that is illustrated discloses that the gate dielectric material portion 44 and the gate conductor portion 46 are the same in the pFET device region 22 and the nFET device region 24, it is also possible to form a gate dielectric material portion and/or a gate electrode portion in the nFET device region that is different from the gate dielectric material portion and/or the gate electrode portion in the pFET device region. In such embodiments, conventional block mask technology can be used in forming the different gate dielectric material portion and/or different gate electrode portion in each of the device regions.

In the embodiment illustrated in the drawings, the gate dielectric material portion 44 is present on three surfaces (i.e., the two vertical sidewalls and the topmost surface) of each germanium-containing semiconductor fin 40 and three surfaces of each second III-V compound semiconductor fin 36 (i.e., the two vertical sidewalls and the topmost surface). In other embodiments, and when a remaining portion of the first sacrificial spacer 32P is still present atop each semiconductor fin, the gate dielectric material portion is located only on the two vertical sidewalls of the semiconductor fins.

The gate dielectric material portion 44 includes any gate dielectric material. In one embodiment, the gate dielectric material that provides the gate dielectric material portion 44 can be a semiconductor oxide, a semiconductor nitride, and/or a semiconductor oxynitride. In one example, the gate dielectric material that provides each gate dielectric material portion 44 can be composed of silicon dioxide, silicon nitride and/or silicon oxynitride. In another embodiment of the present application, the gate dielectric material that provides the gate dielectric material portion 44 may include at least a dielectric metal oxide. Exemplary dielectric metal oxides that can be used as the gate dielectric material that provides the gate dielectric material portion 44 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material that provides the gate dielectric material portion 44.

In some embodiments of the present application, the gate dielectric material that provides the gate dielectric material portion 44 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material that provides the gate dielectric material portion 44 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material that provides the gate dielectric material portion 44 can have a thickness in a range from 1 nm to 10 nm. Other thicknesses that are lesser than or greater than the aforementioned thickness range can also be employed for the gate dielectric material that provides the gate dielectric material portion 44.

The gate conductor portion 46 may comprise any conductive material. Examples of conductive materials that can provide each gate conductor portion 46 include, but are not limited to, doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the conductive material that provides the gate conductor portion 46 is comprised of a doped polysilicon or doped polysilicon germanium. In another embodiment, a lower portion of the conductive material that provides the gate conductor portion 46 is comprised a conductive material other than doped polysilicon or doped polysilicon germanium, and an upper portion of the conductive material that provides the gate conductor portion 46 is comprised of doped polysilicon or doped silicon germanium.

The conductive material that provides the gate conductor portion 46 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the conductive material that provides the gate conductor portion 46 has a thickness from 1 nm to 100 nm. Other thicknesses that are lesser than or greater than the aforementioned thickness range can also be employed for the conductive material that provides the gate conductor portion 46.

As mentioned above, the functional gate structure can be formed by first providing a material stack of, from bottom to top, a gate dielectric material and a conductive material. In some embodiments, block mask technology may be used to form different gate dielectric materials and/or conductive materials within the various device regions. Following the formation of the material stack, the material stack can be patterned by lithography and etching. Lithography can include forming a photoresist (not shown) on the topmost surface of the conductive material of the material stack, exposing the photoresist to a desired pattern of radiation, and then developing the exposed photoresist with a resist developer to provide a patterned photoresist atop the material stack. At least one etch is then employed which transfers the pattern from the patterned photoresist into the various materials of the material stack. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers, the patterned photoresist can be removed utilizing a resist stripping process such as, for example, ashing. After patterning the gate material stack, a functional gate structure including gate dielectric material portion 44 and a gate conductor portion 46 is formed.

At this point of the present application, conventional processing can be used to form a dielectric spacer on the exposed sidewalls of the functional gate structure, and thereafter dopants can be introduced into portions of each germanium-containing semiconductor fin 40 and each III-V compound semiconductor fin 36 not including the functional gate structure and dielectric spacer utilizing techniques that are well known to those skilled in the art to form the source regions and the drain regions of each finFET device. The source regions in each various device region may then be merged utilizing an epitaxial growth process.

In some embodiments, a gate last process (not specifically shown) can be used in forming the at least one functional gate structure. In such an embodiment, a sacrificial gate structure (not shown) is first formed straddling each semiconductor fin within the various device regions. The term "sacrificial gate structure" is used throughout the present application to denote a material that serves as a placeholder structure for a functional gate structure to be subsequently formed.

The sacrificial gate structure can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structures.

Next, a dielectric spacer can be optionally formed on sidewalls of each sacrificial gate structure. The source and drain regions (and the corresponding extension regions) can be formed after formation of the either the sacrificial gate structure or spacer formation. Next, a dielectric material is provided that has an upper surface that is planar to each sacrificial gate structure. Then, each sacrificial gate structure can be replaced with a functional gate structure as defined above.

Figure 16:
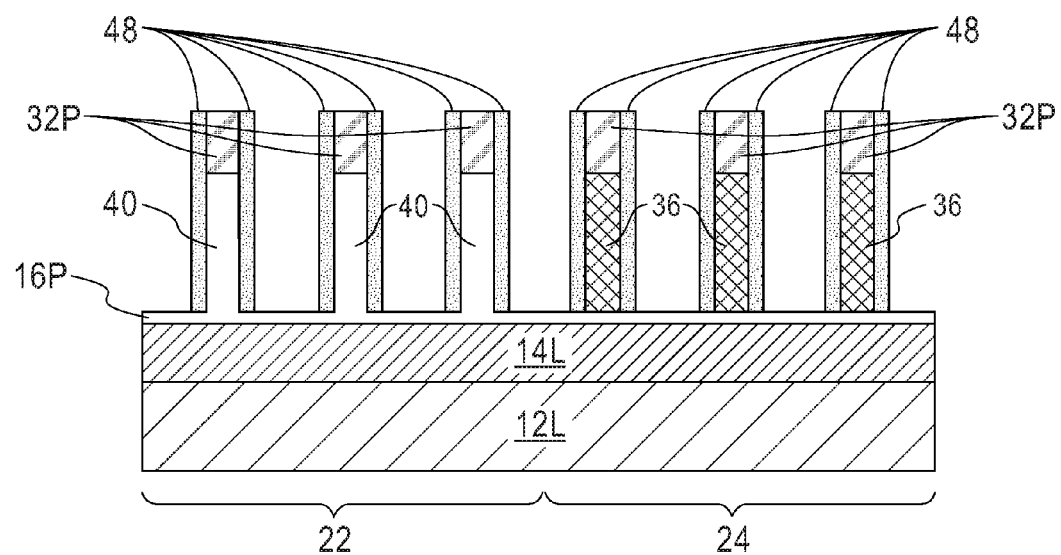
FIG. 16 is a cross sectional view of the exemplary semiconductor structure of FIG. 13 after forming a second sacrificial spacer on sidewall surfaces of each germanium-containing semiconductor fin within the pFET device region and on sidewall surfaces of each III-V compound semiconductor fin within the nFET device region.

Referring now to FIG. 16, there is illustrated the exemplary semiconductor structure of FIG. 13 after forming a second sacrificial spacer 48 on sidewall surfaces of each germanium-containing semiconductor fin 40 within the pFET device region 22 and on sidewall surfaces of each III-V compound semiconductor fin 36 within the nFET device region 24. The second sacrificial spacer 48 can include one of the dielectric spacer materials mentioned above for providing the first sacrificial spacer 32. In one embodiment, each second sacrificial spacer 48 comprises a same spacer dielectric material as the first sacrificial spacer 32. In another embodiment, each second sacrificial spacer 48 comprises a spacer dielectric material that is different from the spacer dielectric material utilizing in providing the first sacrificial spacer 32. The second sacrificial spacer 48 can be formed utilizing the technique mentioned above in forming the first sacrificial spacer 32. In some embodiments of the present application, each second sacrificial spacer 48 has a topmost surface that is coplanar with a topmost surface of the remaining portion of the first sacrificial spacer 32P that is present atop each semiconductor fin 36, 40. Each second sacrificial spacer 48 has a base, i.e., bottommost surface, which is located directly on a surface of the remaining germanium-containing material portion 16P.

Figure 17A:
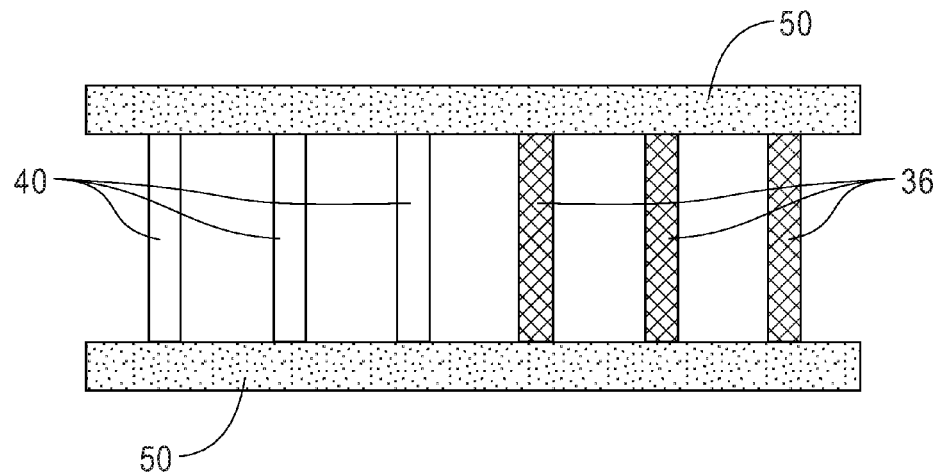
FIG. 17A is a top-down view of the exemplary semiconductor structure of FIG. 16 after forming an anchoring structure, and after performing an etch to undercut each germanium-containing semiconductor fin within the pFET device region and each III-V compound semiconductor fin within the nFET device region.
Figure 17B:
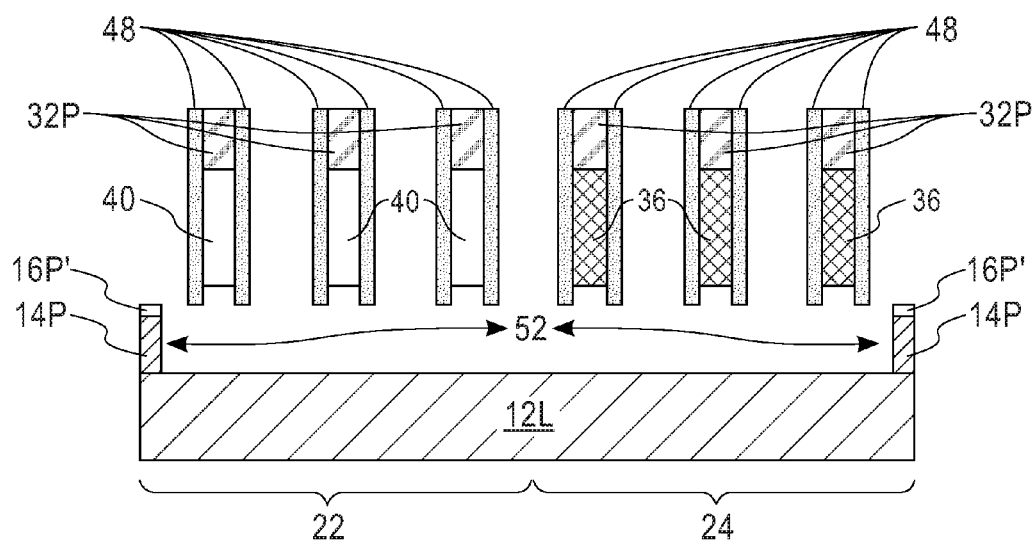
FIG. 17B is a cross sectional view of the exemplary semiconductor structure of FIG. 17A.

Referring now to FIGS. 17A-17B, there are illustrated the exemplary semiconductor structure of FIG. 16 after forming an anchoring structure 50, and after performing an etch to undercut each germanium-containing semiconductor fin 40 within the pFET device region 22 and each III-V compound semiconductor fin 36 within the nFET device region 24; in FIG. 17B, element 52 denotes the undercut region that is formed in the present application. In the top-down view provided in FIG. 17A, only the anchoring structure 50 and the germanium-containing semiconductor fins 40, and the III-V compound semiconductor fins 36 are shown for clarity.

The anchoring structure 50 is located on each width-wise end segment of each semiconductor fin 36, 40 and is in contact with a portion of the remaining germanium-containing material portion 16P. The anchoring structure 50 comprises a dielectric material that is different in terms of its composition from that of the dielectric spacer material that provides at least the second sacrificial spacer 48. In one embodiment of the present application, the anchoring structure 50 is comprised of a dielectric oxide such as, for example, silicon dioxide. The anchoring structure 50 can be formed by deposition of a dielectric material and then the deposited dielectric material can be patterned by lithography and etching to form the structure shown in FIGS. 17A-17B.

After providing the anchoring structure 50, an etch is performed that undercuts each germanium-containing semiconductor fin 40 within the pFET device region 22 and each III-V compound semiconductor fin 36 within the nFET device region 24. The etch removes the remaining germanium-containing semiconductor material portion 16P and the underlying intermediate layer of germanium 14L from beneath each germanium-containing semiconductor fin 40 and beneath each III-V compound semiconductor fin 36. Thus, the etch exposes a topmost surface of the underlying silicon material layer 12L. In the drawings, element 14P denotes a remaining portion of the intermediate germanium layer 14, while element 16P' represents another remaining portion of the germanium-containing semiconductor portion 16P. The etch used to form the undercut region 52 includes an etching process that selective removes germanium as compared to dielectric materials. In one example, diluted aqueous hydrogen peroxide ($H_2O_2$) can be used to provide the undercut region 52 beneath each of the semiconductor fins.

Figure 18:
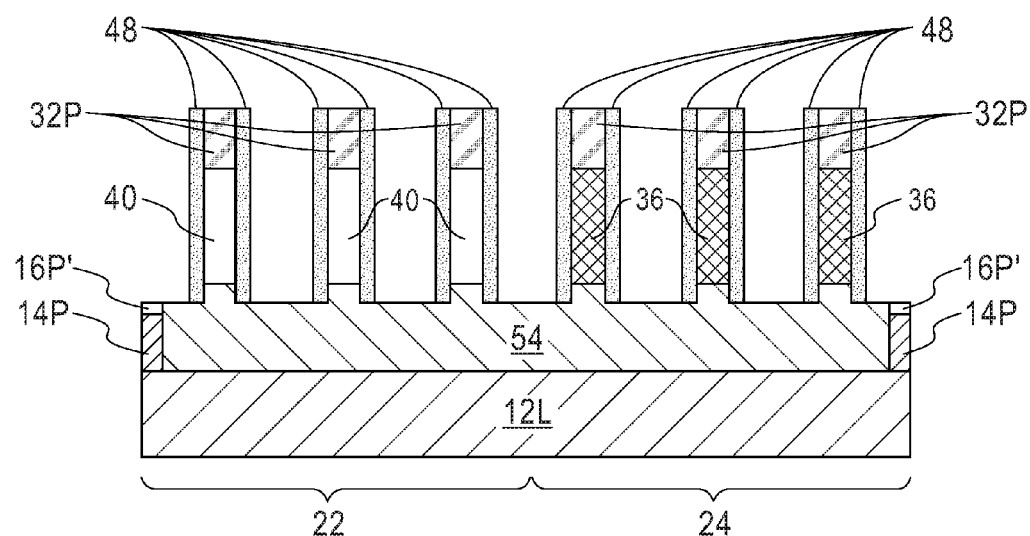
FIG. 18 is a cross sectional view of the exemplary semiconductor structure of FIGS. 17A-17B after forming an isolation structure in the undercut area located beneath each germanium-containing semiconductor fin within the pFET device region and each III-V compound semiconductor fin within the nFET device region.

Referring now to FIG. 18, there is illustrated the exemplary semiconductor structure of FIGS. 17A-17B after forming an isolation structure 54 in the undercut area 52 located beneath each germanium-containing semiconductor fin 40 within the pFET device region 22 and each III-V compound semiconductor fin 36 within the nFET device region 24. As is shown, a portion of the isolation structure 54 contacts a bottommost surface of each germanium-containing semiconductor fin 40 and a bottommost surface of each III-V compound semiconductor fin 36.

The isolation structure 54 may comprise a dielectric material such as, for example, an oxide. In one embodiment, the isolation structure comprising silicon dioxide. The dielectric material that provides the isolation structure 54 may be the same or different, typically the same, as the dielectric material used to provide the anchoring structure 50. The isolation structure 54 can be formed by deposition of a dielectric material and then the deposited dielectric material can be recessed utilizing an etch back process.

Figure 19:
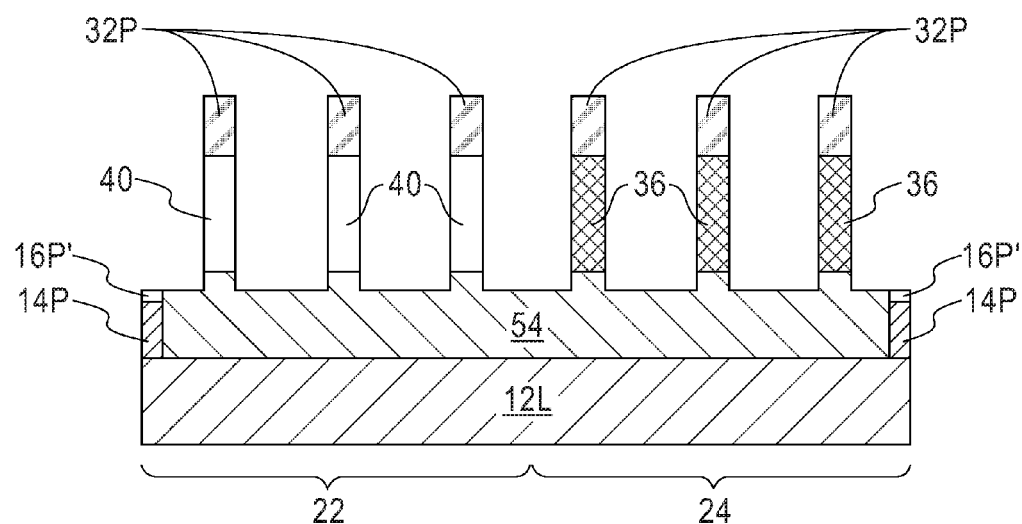
FIG. 19 is a cross sectional view of the exemplary semiconductor structure of FIG. 18 after removing each second sacrificial spacer.

Referring now to FIG. 19, there is illustrated the exemplary semiconductor structure of FIG. 18 after removing each second sacrificial spacer 48. Each second sacrificial spacer 48 can be removed by an etch process. In one example, a reactive ion etch can be used to remove each second sacrificial spacer 48. In some embodiments (not shown), this etch may also remove the remaining first sacrificial spacer 32P from the topmost surface of each of the semiconductor fins 36, 40. Each of the germanium-containing semiconductor fins 40 and each of the III-V compound semiconductor fins 36 are spaced at a first pitch, p. Also, the nearest neighboring pair of germanium-containing semiconductor fin 40 and III-V compound semiconductor fin 36 is spaced at the same pitch (i.e., the first pitch) as the pitch between individual same semiconductor material fins. The pitch can be between 20 nm and 100 nm. In the present application, the pitch (i.e. first pitch) is defined as the space between fin plus fin width.

Figure 20:
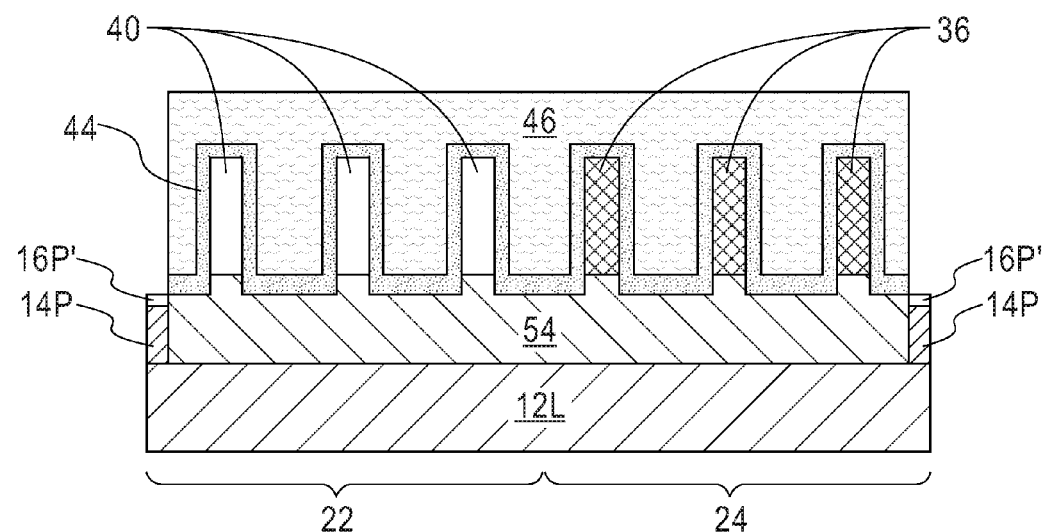
FIG. 20 is a cross sectional view of the exemplary semiconductor structure of FIG. 19 after removing a remaining portion of the first sacrificial spacer from atop each germanium-containing semiconductor fin within the pFET device region and from atop each III-V compound semiconductor fin within the nFET device region, and forming a functional gate structure straddling each germanium-containing semiconductor fin within the pFET device region and each III-V compound semiconductor fin within the nFET device region.

Referring now to FIG. 20, there is illustrated the exemplary semiconductor structure of FIG. 19 after removing a remaining portion of the first sacrificial spacer 32P from atop each germanium-containing semiconductor fin 40 within the pFET device region 22 and from atop each III-V compound semiconductor fin 36 within the nFET device region 24, and forming a functional gate structure (44, 46) straddling each germanium-containing semiconductor fin 40 within the pFET device region 22 and each III-V compound semiconductor fin 36 within the nFET device region 24. In some embodiments, the first remaining portion of the first sacrificial spacer 32P can remain atop each of the semiconductor. The removal of remaining portion of the first sacrificial spacer 32P can be performed by etching or by a planarization process.

Each functional gate structure (44, 46) can include a gate dielectric material portion 44, and a gate conductor portion 46 as defined above and each functional gate structure can be formed utilizing a gate-first or gate-last process as also described above.

Figure 21:
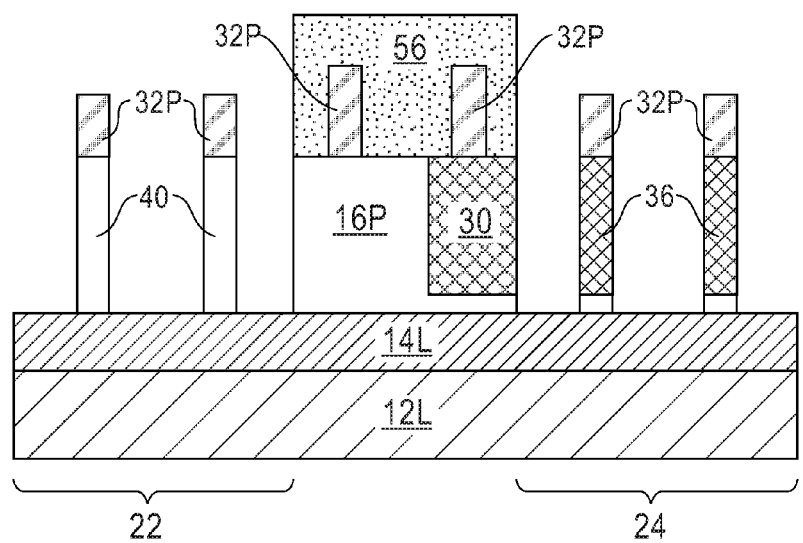
FIG. 21 is a cross sectional view of the exemplary semiconductor structure of FIG. 8 after forming another block mask at a boundary between the pFET device region and the nFET device region, and then forming a plurality of germanium-containing fins within the pFET device region and a plurality of III-V compound semiconductor fins in the nFET device region.

Referring now to FIG. 21, there is illustrated the exemplary semiconductor structure of FIG. 8 after forming another block mask 56 at a boundary between the pFET device region 22 and the nFET device region 24, and then forming a plurality of germanium-containing fins 40 within the pFET device region 22 and a plurality of III-V compound semiconductor fins 36 in the nFET device region 24. The another block mask 56 may include one of block mask materials mentioned above in forming the first block mask 34. Also, the another block mask 56 can be formed utilizing a technique mentioned above in forming the first block mask 34. In this embodiment, the another block mask protects an area of the structure in which other devices, such as, for example, a tunnel FET can be formed.

After forming the another block mask 56, process continues in forming the plurality of germanium-containing fins 40 within the pFET device region 22 and the plurality of III-V compound semiconductor fins 36 in the nFET device region 24 as described above. After forming the semiconductor fins, the process disclosed in FIGS. 13-15 or FIGS. 16-20 can be performed.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed as new is:

1. A semiconductor structure comprising:
  a plurality of germanium-containing semiconductor fins located in a pFET device region and laterally separated from each other by a pitch of from 20 nm to 100 nm;
  a plurality of III-V compound semiconductor fins located in an nFET device region and laterally separated from each other by said pitch,
  wherein a neighboring pair of one germanium-containing fin of said plurality of germanium-containing semiconductor fins and one III-V compound semiconductor fin of said plurality of III-V compound semiconductor fins is laterally separated by said pitch, wherein each germanium-containing semiconductor fin and each III-V compound semiconductor fin is located directly on a germanium-containing material layer that is continuously present on an entirety of a topmost surface of a semiconductor material stack in both the nFET device region and the pFET device region, wherein said germanium-containing material layer and each germanium-containing fin are of composed of a same relaxed germanium-containing material;
  a local isolation structure located on exposed surfaces of said germanium-containing material layer; and
  a functional gate structure surrounding each germanium-containing semiconductor fin of said plurality of germanium-containing semiconductor fins and each III-V compound semiconductor fin of said plurality of II-V compound semiconductor fins, and present on said local isolation structure.

2. The semiconductor structure of claim 1, wherein said semiconductor material stack comprises, from bottom to top, a silicon material layer and an intermediate germanium layer.

3. The semiconductor structure of claim 1, wherein each germanium-containing semiconductor fin comprises unalloyed germanium.

4. The semiconductor structure of claim 1, wherein each germanium-containing semiconductor fin comprises a silicon germanium alloy.

5. A semiconductor structure comprising:
  a plurality of germanium-containing semiconductor fins located in a pFET device region and laterally separated from each other by a pitch of from 20 nm to 100 nm;
  a plurality of III-V compound semiconductor fins located in an nFET device region and laterally separated from each other by said pitch,
  wherein a neighboring pair of one germanium-containing fin of said plurality of germanium-containing semiconductor fins and one III-V compound semiconductor fin of said plurality of III-V compound semiconductor fins is laterally separated by said pitch, and further wherein each germanium-containing semiconductor fin of said plurality of germanium-containing semiconductor fins and each III-V compound semiconductor fin of said plurality of III-V compound semiconductor fins have a bottommost surface that is present directly on a topmost surface of a pedestal portion of an isolation structure that is present entirely beneath each germanium-containing semiconductor fin and each III-V compound semiconductor fin; and a functional gate structure surrounding each germanium-containing semiconductor fin of said plurality of germanium-containing semiconductor fins and each III-V compound semiconductor fin of said plurality of II-V compound semiconductor fins, and present on said isolation structure.

6. The semiconductor structure of claim 5, wherein each germanium-containing semiconductor fin comprises unalloyed germanium.

7. The semiconductor structure of claim 5, wherein each germanium-containing semiconductor fin comprises a silicon germanium alloy.

8. The semiconductor structure of claim 5, wherein a material stack of, from bottom to top, an intermediate germanium layer and a relaxed germanium-containing material layer is present adjacent outermost sidewalls of said isolation structure.

* * * * *